(12) United States Patent
Daly

(10) Patent No.: US 6,494,174 B1
(45) Date of Patent: Dec. 17, 2002

(54) WIRING HARNESS ASSEMBLY FOR AN INTAKE MANIFOLD

(75) Inventor: Paul D. Daly, Troy, MI (US)

(73) Assignee: Siemens VDO Automotive Inc., Tilbury (CA)

( * ) Notice: Subject to any disclaimer, the term of this patent is extended or adjusted under 35 U.S.C. 154(b) by 27 days.

(21) Appl. No.: 09/695,478

(22) Filed: Oct. 24, 2000

Related U.S. Application Data

(60) Provisional application No. 60/162,517, filed on Oct. 29, 1999.

(51) Int. Cl.[7] .......................... F02M 35/104; F02P 23/00
(52) U.S. Cl. ............................... 123/143 C; 123/184.61
(58) Field of Search ..................... 123/143 C, 184.21, 123/184.61, 195 E, 195 C, 198 E

(56) References Cited

U.S. PATENT DOCUMENTS

| | | |
|---|---|---|
| 2,488,096 A | 11/1949 | Newman |
| 2,509,093 A | 5/1950 | Field |
| 4,776,313 A | 10/1988 | Freismuth et al. |
| 4,805,564 A | 2/1989 | Hudson, Jr. |
| 5,003,933 A | 4/1991 | Rush, II et al. |
| 5,163,406 A | 11/1992 | Daly et al. |
| 5,189,782 A | 3/1993 | Hickey |
| 5,209,204 A | 5/1993 | Bodenhausen et al. |
| 5,211,149 A | 5/1993 | DeGrace, Jr. |
| 5,218,936 A | 6/1993 | Pritz et al. |
| 5,295,468 A | 3/1994 | Blessing et al. |
| 5,323,749 A | 6/1994 | Gras et al. |
| 5,349,930 A | 9/1994 | Maruyama et al. |
| 5,353,767 A | 10/1994 | Carbone et al. |
| 5,357,931 A | 10/1994 | Semence |
| 5,390,648 A * | 2/1995 | Yanase ........................ 123/634 |
| 5,447,140 A | 9/1995 | Brisbane et al. |
| 5,568,794 A * | 10/1996 | Tabuchi et al. ......... 123/195 E |
| 5,598,824 A | 2/1997 | Treusch et al. |
| 5,743,235 A * | 4/1998 | Lueder .................... 123/143 C |
| 5,771,850 A * | 6/1998 | Okada ..................... 123/143 C |
| 5,996,543 A * | 12/1999 | Nakayama et al. .... 123/184.21 |
| 6,186,106 B1 * | 2/2001 | Glovatsky et al. ...... 123/143 C |
| 6,279,527 B1 * | 8/2001 | Glovatsky et al. ...... 123/143 C |

FOREIGN PATENT DOCUMENTS

| | | | |
|---|---|---|---|
| DE | 43 05 684 A1 * | 2/1993 | ............. F02P/3/02 |
| DE | 198 42 041 | 3/1999 | |
| EP | 0 872 384 | 10/1998 | |
| EP | 1 096 134 A2 * | 5/2001 | ......... F02M/35/104 |
| JP | 05114310 | 5/1993 | |
| JP | 10-176544 | * 6/1998 | ........... F02B/77/00 |

* cited by examiner

Primary Examiner—Hieu T. Vo

(57) ABSTRACT

A wiring assembly for a plastic intake manifold mounted to an internal combustion engine of a motor vehicle includes a flexible circuit assembly disposed within foam covering the intake manifold. The flexible circuit assembly provides for electrical communication between a controller and a plurality of electrical devices. In one embodiment the electrical devices are integral to the flexible circuit assembly to create a flexible circuit/electrical device assembly forming a single replaceable unit. In another embodiment, multiple flexible circuits are sandwiched between layers of foam, with each flexible circuit separated from the others by layers of foam. Each of the multiple flexible circuits attaches to different types electrical devices or sensors. The invention also provides for a decorative skin disposed over the layers of foam that may include a printed design to eliminate the need for an additional decorative engine cover.

15 Claims, 2 Drawing Sheets

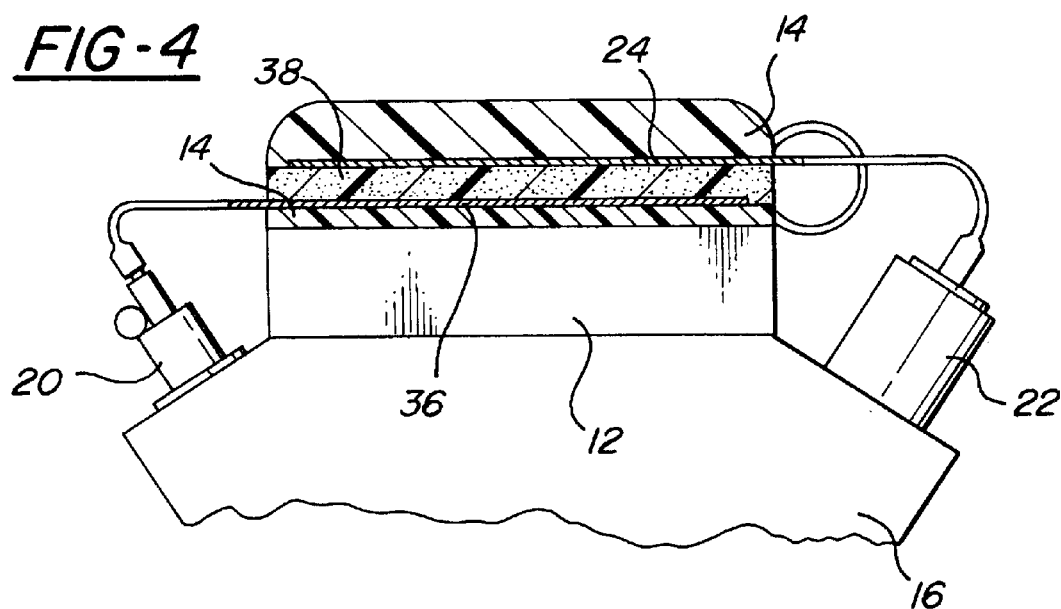
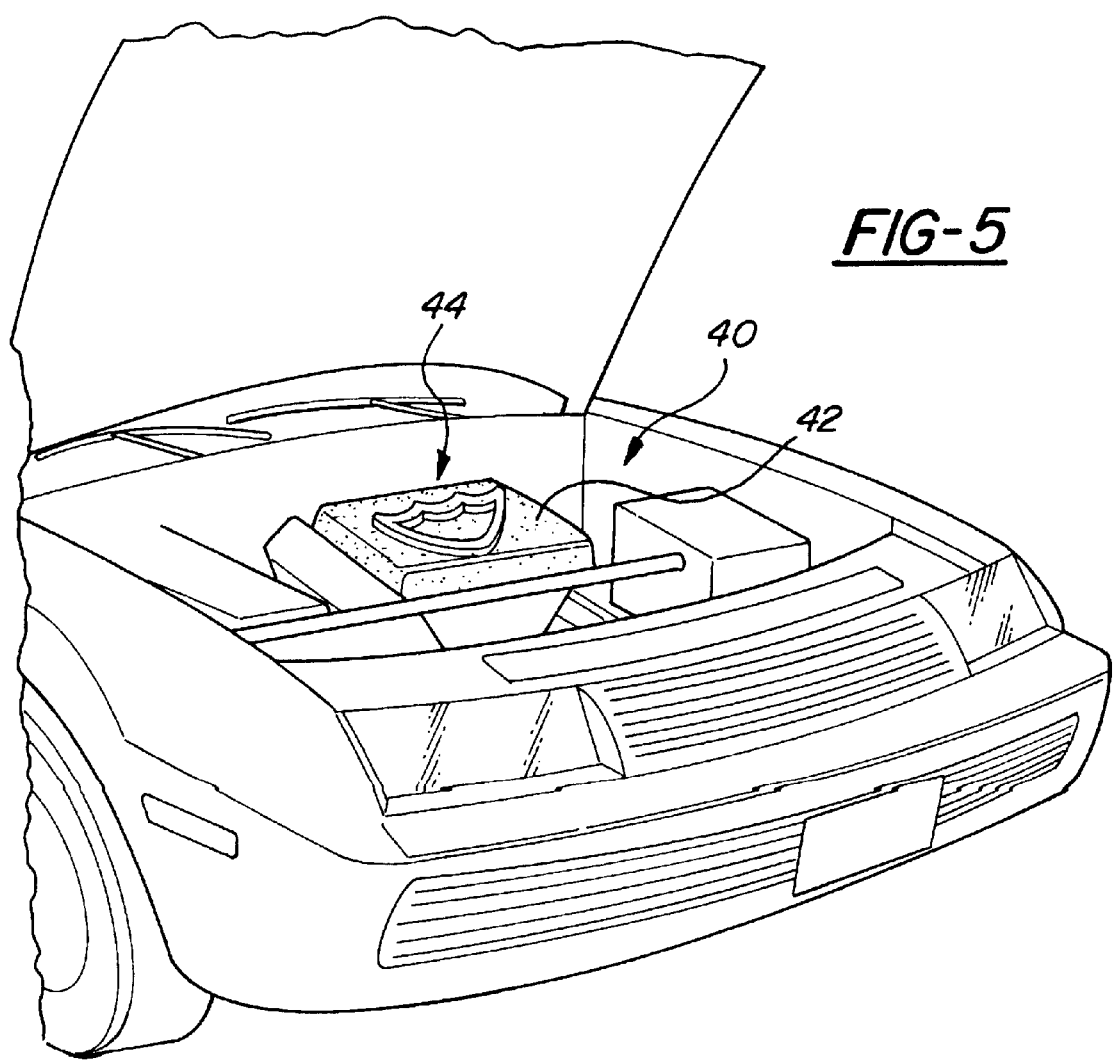

WIRING HARNESS ASSEMBLY FOR AN INTAKE MANIFOLD

This application claims priority to provisional application serial No. 60/162,517 filed on Oct. 29, 1999.

BACKGROUND OF THE INVENTION

This invention relates to a wiring harness for an air intake manifold including a flexible circuit sandwiched between layers of foam attached to the intake manifold.

Typically an air intake manifold includes a plurality of sensors and actuators for monitoring and controlling a motor vehicle engine. A wiring harness having a plurality of multi-strand wires provides for electrical communication between the sensors, actuators and an engine controller. Typically wiring harnesses are fabricated by crimping terminals onto multi-stranded wires, then hand assembling the terminals into a plastic connector. Wiring harnesses fabricated in this manner are unreliable because of the possibility that an errant strand of wire that was not crimped may cause a circuit disabling short. More problematic is the errant strand of wire that may cause an intermittent short that are difficult and time consuming to diagnose and correct. Another problem inherent in typical wiring harnesses derives from the random bundling of the wires. Random bundling of wires may cause electromagnetic or radio frequency interference between wires in the bundle. The interference will be difficult to detect and can cause the degradation of sensor and actuator function.

Recently intake manifolds are being fabricated from plastic. Plastic manifolds have challenges relating to noise properties. Typically, a layer of foam covering the plastic intake manifold is thus used to dampen noise. The layer of foam will either include a plurality of cut outs to accommodate mounting of the plurality of sensors and actuators, or a single uniform layer of foam covering both the intake manifold and the plurality of sensors and actuators.

Current wiring harnesses are deficient because they require many expensive and unreliable hand operations that may result in intermittent electrical problems that are difficult to diagnose and correct. Further, intermittent electrical problems may cause repeated trips to a repair facility causing increasing customer dissatisfaction. For these reasons, it is desirable to provide a wiring harness that can be integrated with the layers of noise reducing foam to provide noise abatement, ease assembly and reduce occurrences of intermittent electrical shorts.

SUMMARY OF THE INVENTION

The subject invention is a wiring harness for an intake manifold mounted to an internal combustion engine including a flexible circuit assembly included within foam attached to the top of the intake manifold. The flexible circuit assembly replaces the plurality of multi-stranded wires included in a typical wiring harness. The flexible circuit assembly of the subject invention offer benefits over prior art wiring harnesses by reducing weight, lowering manufacturing costs, improving reliability, and simplifying problem diagnosis and repair. Further, because the flexible circuit assembly is comprised of a plurality of individual printed circuits arranged in a predetermined pattern; the amount of electromagnetic and radio frequency interference can be predicted and corrected during design of the flexible circuit assembly.

In an additional embodiment of the subject invention, the sensors and actuators are part of the circuit assembly. Integrating the sensors and actuators with the circuit assembly provides for ease of assembly and repair. The ease of repair is attained by providing for replacement of all the electrical components along with the circuit assembly instead of requiring a maintenance technician to track an electrical problem to one of the multiple wires, actuators or sensors. Replacement of the circuit assembly, sensors and actuators as a single unit reduces the amount of time required to correct an electrical problem and prevents multiple trips to a repair facility caused by miss-diagnosis of the electrical problem.

Most preferably the flexible circuit is sandwiched between foam layers, although it could also be molded into a single foam layer.

The subject invention overcomes the deficiencies of prior art multi-strand, multi-wire wiring harness by providing a flexible circuit assembly that reduces weight, eases assembly and reduces the time required to diagnose and correct electrical problems.

BRIEF DESCRIPTION OF THE DRAWINGS

The various features and advantages of this invention will become apparent to those skilled in the art from the following detailed description of the currently preferred embodiment. The drawings that accompany the detailed description can be briefly described as follows:

FIG. 4 is a cross-sectional view of an alternate embodiment including multiple flexible circuit assemblies disposed between the layers of foam; and FIG. 5 is perspective view of an engine compartment and of the intake manifold with a decorative skin having a printed design.

DETAILED DESCRIPTION OF THE PREFERRED EMBODIMENT

Figure 1:
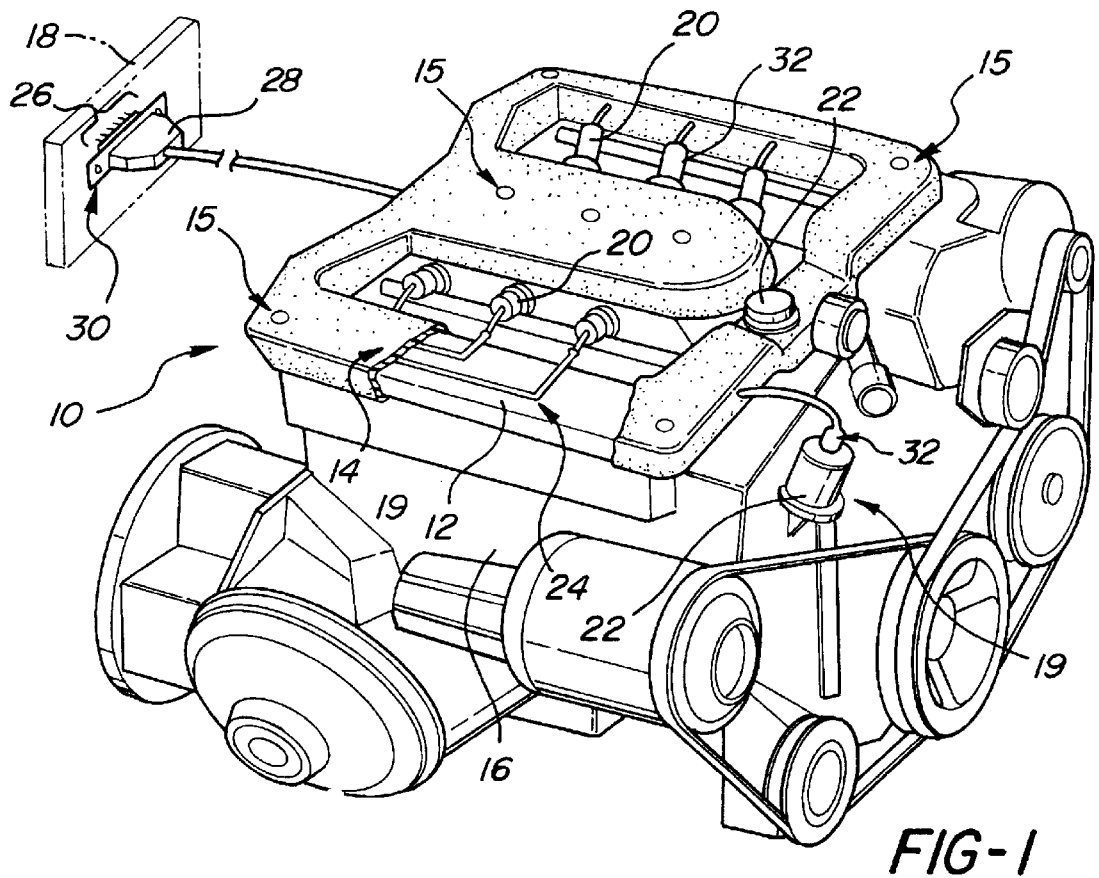
FIG. 1 is a perspective view of an intake manifold with the flexible circuit assembly mounted to an internal combustion engine.

Referring to the Figures, wherein like numerals indicate like or corresponding parts throughout the several views, the subject invention shown in FIG. 1 is a wiring assembly 10 for an intake manifold 12 having a flexible circuit assembly 24 sandwiched between layers of foam 14 attached to the intake manifold 12. The intake manifold 12 is mounted to an internal combustion engine 16 to provide for regulation of an air fuel mixture. A plurality of electrical devices 19 disposed within or near the intake manifold communicate with a controller 18 to control and monitor the engine 16. The electrical devices 19 include fuel injectors 20 for regulating the amount of fuel mixed with air drawn through the intake manifold 12 and into the engine 16. The electrical devices 19 also include sensors 22 that communicate current engine 16 conditions to the controller 18. The sensors 22 may be of any type known in the art including but not limited to a throttle position sensor, a knock sensor, an engine temperature sensor, and an EGR valve. The operational details of these devices are as known in the art and form no part in this invention.

Terminals 26 crimped to the flexible circuit assembly 24 and disposed within a plastic connector body 28 form the connection between the flexible circuit assembly 24 and the controller 18. A connector 32 attaches to each electrical device 19. An input connector 30 attached to the flexible circuit assembly 24 provides for communication between the electrical devices 19 and the controller 18.

The intake manifold 12 in the preferred embodiment is fabricated from plastic and covered with layers of foam 14 to abate noise emanating from the intake manifold 12. The layers of foam 14 are secured to the intake manifold 12 by mechanical attachments shown schematically at 15. The mechanical attachment 15 may be on any type known to those knowledgeable in the art, including a post and barb style clip, or the layers of foam may be secured by a decorative plastic engine covered attached to the intake manifold 12.

Figure 2:
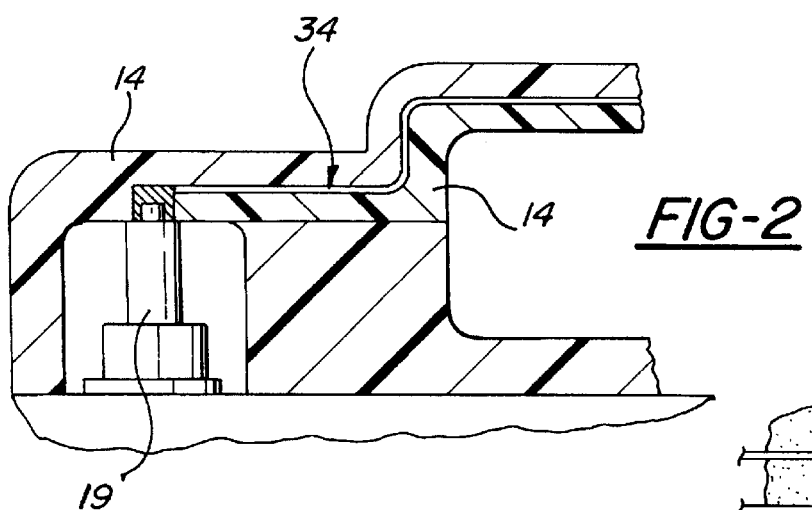
FIG. 2; is a cross-sectional view of an alternate embodiment of the flexible circuit assembly with integrated electrical devices.

A flexible circuit assembly 24 is sandwiched between the layers of foam 14 and connected to the plurality of electrical devices 19. Referring to FIG. 2, an alternate embodiment of the subject invention integrates each of the electrical devices 19 into the flexible circuit assembly 24 to form a one-piece flexible circuit/electrical device assembly 34. The flexible circuit/electrical device assembly 34 does not require the connectors 32 because each of the electrical devices are terminated directly to the flexible circuit assembly 24. The flexible circuit/electrical device assembly 34 allows for ease of replacement to facilitate repair. The flexible circuit/ electrical device assembly 34 allows a maintenance technician to replace all electrical devices 19 as one unit instead of consuming an inordinate amount of time isolating and replacing the one disabled electrical device 19.

Figure 3:
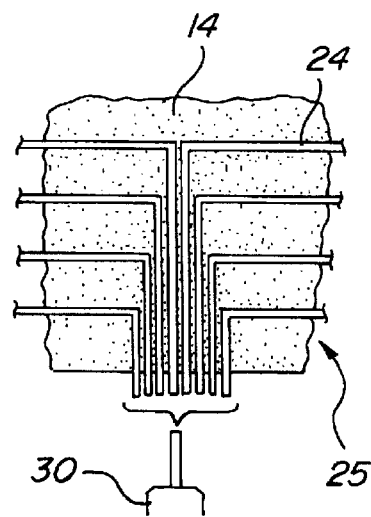
FIG. 3 is a top view of an alternate embodiment of the flexible circuit assembly with the flexible circuit assembly formed onto a layer of foam.

The flexible circuit assembly 24 may be fabricated by any method known in the art. Methods of fabricating the circuit assembly 24 include photographic processes and extruding processes. Referring to FIG. 3, an embodiment of the subject invention utilizes the photographic process to form the flexible circuit 24 onto one of the layers of foam 14. The integrated flexible circuit and layer of foam 25 would then be sandwiched between other layers of foam 14 and attached to the plurality of electrical devices 19. It should be understood that any method known in the art may be used to fabricate the circuit assembly.

Referring to FIG. 4, another embodiment of the subject invention includes additional separate flexible circuits 36. The additional separate flexible circuits 36 may be added to connect and isolate specific types of electrical devices 19. Specifically, a separate flexible circuit 36 is provided for connection to the fuel injectors 20 and a second flexible circuit assembly provides for connection to the sensors 22 disposed within or adjacent to the intake manifold 12. Each of the additional flexible circuits 36 may be separated from the other flexible circuits 36 by a third additional layer of foam 38.

The layers of foam of the subject invention provide for the abatement of noise emanating from the intake manifold 12, and additionally provide protection of the flexible circuit assembly 24 from the environment present within a motor vehicle engine compartment 40. A plastic cover (not shown) may be provided to cover the layers of foam 14 and the intake manifold 12 to provide for an aesthetically pleasing appearance. Referring to FIG. 5, an additional embodiment of the subject invention provides a decorative skin 42 disposed on the layers of foam 14, thereby eliminating the need for the plastic cover. A printed design 44 may be printed onto the decorative skin 42. A variation of this embodiment would provide for custom printing of a specific customer selected design onto the decorative skin 42. The customer is able to select any design and have that design custom printed onto the decorative skin 42 for assembly to the vehicle.

The foregoing description is exemplary, and not just a material specification.

The invention has been described in an illustrative manner, and should be understood that the terminology used is intended to be in the nature of words of description rather than of limitation. Many modifications and variations of the present invention are possible in light of the above teachings. The preferred embodiments of this invention have been disclosed, however, one of ordinary skill in the art would recognize that certain modifications are within the scope of this invention. It is understood that within the scope of the appended claims, the invention may be practiced otherwise than as specifically described. For that reason the following claims should be studied to determine the true scope and content of this invention.

What is claimed is:

1. A wiring harness assembly for an intake manifold mounted to an internal combustion engine comprising;

a plurality of electrical devices;

at least two layers of foam disposed on said intake manifold; and a flexible circuit assembly sandwiched between said layers of foam and connected to said plurality of electrical devices.

2. The assembly of claim 1, wherein said flexible circuit assembly includes at least one input connector and a plurality of output connectors for attachment to said plurality of electrical devices.

3. The assembly of claim 1, wherein said flexible circuit is formed onto one of said layers of foam.

4. The assembly of claim 1, further including a plurality of flexible circuits sandwiched between said layers of foam, each of said flexible circuits separated from each of the other flexible circuits by said layers of foam.

5. The assembly of claim 1, further including another flexible circuit assembly and a third layer of foam, said third layer of foam separating said flexible circuit assemblies sandwiched between said layers of foam.

6. The assembly of claim 1, wherein said flexible circuit assembly and said electrical devices are one integral assembly such that the entire flexible circuit assembly and said electrical devices are replaceable as one unit.

7. The assembly of claim 1, wherein said foam is attached to said intake manifold with a plurality of mechanical fasteners.

8. The assembly of claim 1, wherein said intake manifold is fabricated from a plastic material.

9. The assembly of claim 1, wherein one of said layers of foam includes a decorative skin.

10. The assembly of claim 9, wherein said decorative skin further includes a printed design.

11. A wiring harness assembly for an intake manifold mounted to an internal combustion engine comprising;

at least two layers of foam disposed on said intake manifold;

a flexible circuit assembly including a plurality of integral electrical devices;

said flexible circuit assembly sandwiched between said layers of foam and said flexible circuit assembly and said electrical devices are replaceable as one unit.

12. The assembly of claim 11, wherein said flexible circuit assembly includes an output connector for connection to a controller of the motor vehicle.

13. The assembly of claim 11, wherein said plurality of electrical devices includes at least one fuel injector.

14. The assembly of claim 11, wherein said plurality of electrical devices includes sensors disposed within said intake manifold.

15. The assembly of claim 11, wherein said intake manifold is fabricated from plastic.

* * * * *